(12) United States Patent
Kiyooka

(10) Patent No.: US 9,984,731 B2
(45) Date of Patent: May 29, 2018

(54) STORAGE DEVICE AND STORAGE METHOD

(71) Applicant: Toshiba Memory Corporation, Minato-Ku, Tokyo (JP)

(72) Inventor: Masahiro Kiyooka, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 106 days.

(21) Appl. No.: 14/971,856

(22) Filed: Dec. 16, 2015

(65) Prior Publication Data

US 2017/0068466 A1    Mar. 9, 2017

Related U.S. Application Data

(60) Provisional application No. 62/214,157, filed on Sep. 3, 2015.

(51) Int. Cl.
| | |
|---|---|
| *G06F 12/00* | (2006.01) |
| *G11C 7/04* | (2006.01) |
| *G11C 16/10* | (2006.01) |
| *G11C 16/32* | (2006.01) |
| *G11C 16/34* | (2006.01) |
| *G11C 16/04* | (2006.01) |

(52) U.S. Cl.
CPC ............. *G11C 7/04* (2013.01); *G11C 16/10* (2013.01); *G11C 16/32* (2013.01); *G11C 16/349* (2013.01); *G11C 16/0483* (2013.01)

(58) Field of Classification Search
CPC ..... G11C 16/0483; G11C 16/10; G11C 16/32; G11C 16/349; G11C 7/04
See application file for complete search history.

(56) References Cited

U.S. PATENT DOCUMENTS

| | | | |
|---|---|---|---|
| 7,403,440 B2 | 7/2008 | Perner | |
| 2008/0169860 A1 | 7/2008 | Song | |
| 2016/0117216 A1* | 4/2016 | Muchherla | ............. G06F 11/08 714/6.11 |

FOREIGN PATENT DOCUMENTS

| | | |
|---|---|---|
| JP | 2008-310888 A | 12/2008 |
| JP | 2009-003843 A | 1/2009 |
| JP | 2011-081694 A | 4/2011 |

* cited by examiner

*Primary Examiner* — Yong Choe
(74) *Attorney, Agent, or Firm* — White & Case LLP

(57) ABSTRACT

According to one embodiment, a storage device includes a plurality of nonvolatile semiconductor memories, a sensor and a controller. The sensor is configured to measure a temperature of the nonvolatile semiconductor memories. The controller is configured to receive data from a host, determine a rewriting interval of the data and write the data to, of the nonvolatile semiconductor memories, a nonvolatile semiconductor memory having a temperature corresponding to the rewriting interval.

20 Claims, 2 Drawing Sheets

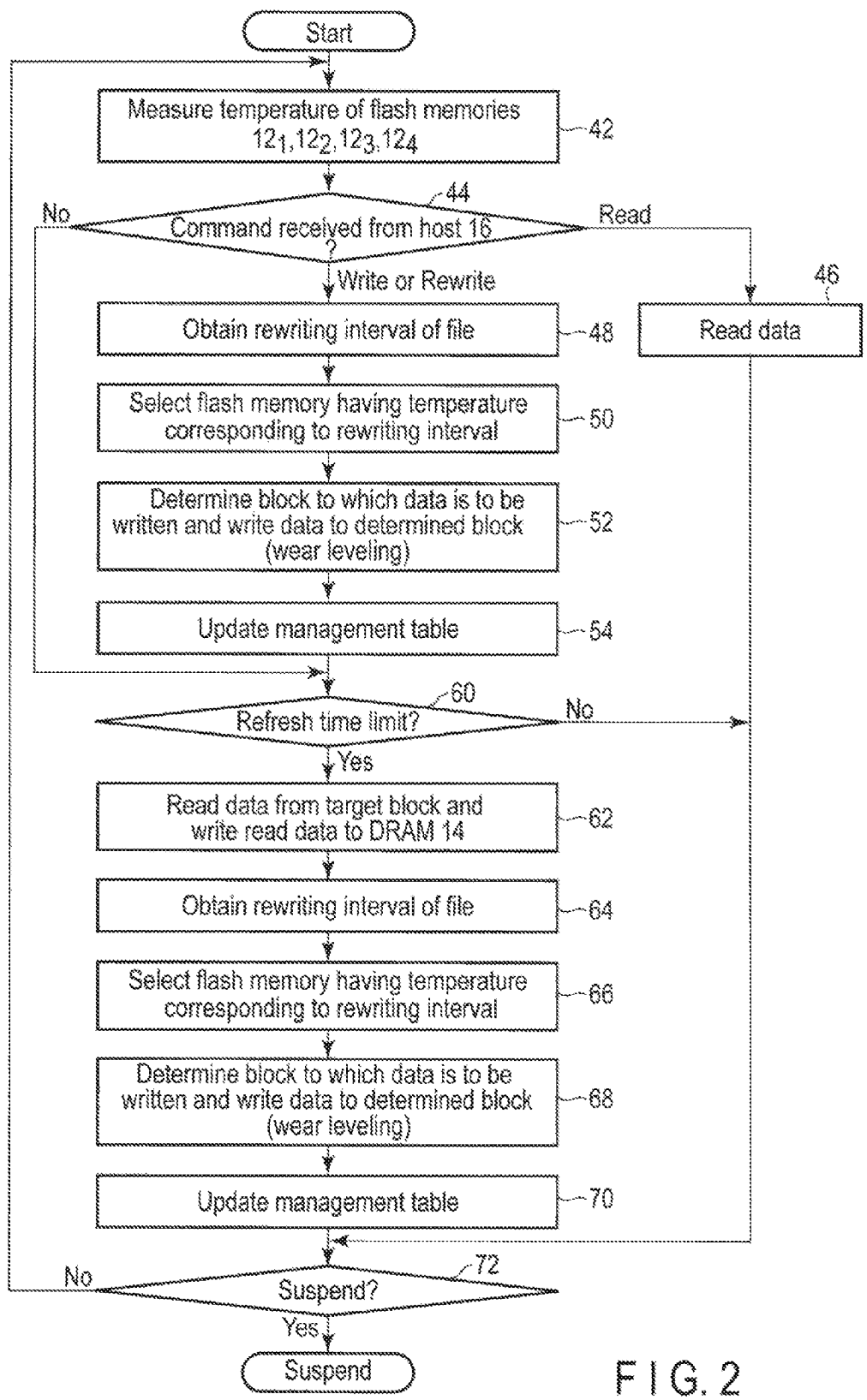
F I G. 2

STORAGE DEVICE AND STORAGE METHOD

CROSS-REFERENCE TO RELATED APPLICATIONS

This application claims the benefit of U.S. Provisional Application No. 62/214,157, filed Sep. 3, 2015, the entire contents of which are incorporated herein by reference.

FIELD

Embodiments described herein relate generally to a storage device including a nonvolatile semiconductor memory.

BACKGROUND

As such a storage device, a solid-state drive (SSD) including a nonvolatile semiconductor memory such as a flash memory is known. In line with an increase in the capacity of a flash memory, SSDs are used in place of conventional hard disk drives (HDDs). In the flash memory, a floating gate covered by an insulating film is formed in a memory cell transistor. Data is stored by applying a potential to the floating gate. The threshold voltage of the memory cell transistor is changed depending on the presence or absence of gate potential. By this change, the stored data is read. However, repetition of data erasing and writing leads to deterioration of the insulating film which covers the floating gate (the combination of erasing and writing may be referred to as rewriting). The potential applied to the floating gate is lost over time. Ultimately, no potential remains. Thus, correct data cannot be read. In other words, the stored data is lost.

To solve this problem, in the SSD, a refresh process is performed. In the refresh process, the stored data is read from the memory and is rewritten before the data is lost. For example, the refresh process is performed when the power source is switched on, or the refresh process is performed in predetermined regular time intervals while the power source is in an on-state. Potential is applied again to the floating gate by the refresh process. Thus, the loss of the stored data is prevented. However, since the refresh process requires reading and rewriting, reading and writing of the host is suspended during the refresh process. Thus, the reading and writing performance of the host is degraded.

BRIEF DESCRIPTION OF THE DRAWINGS

A general architecture that implements the various features of the embodiments will now be described with reference is the drawings. The drawings and the associated descriptions are provided to illustrate the embodiments and not to limit the scope of the invention.

FIG. 2 is a flowchart showing a typical example of the flow of a process performed by the storage device according to the embodiment.

DETAILED DESCRIPTION

Figure 1:
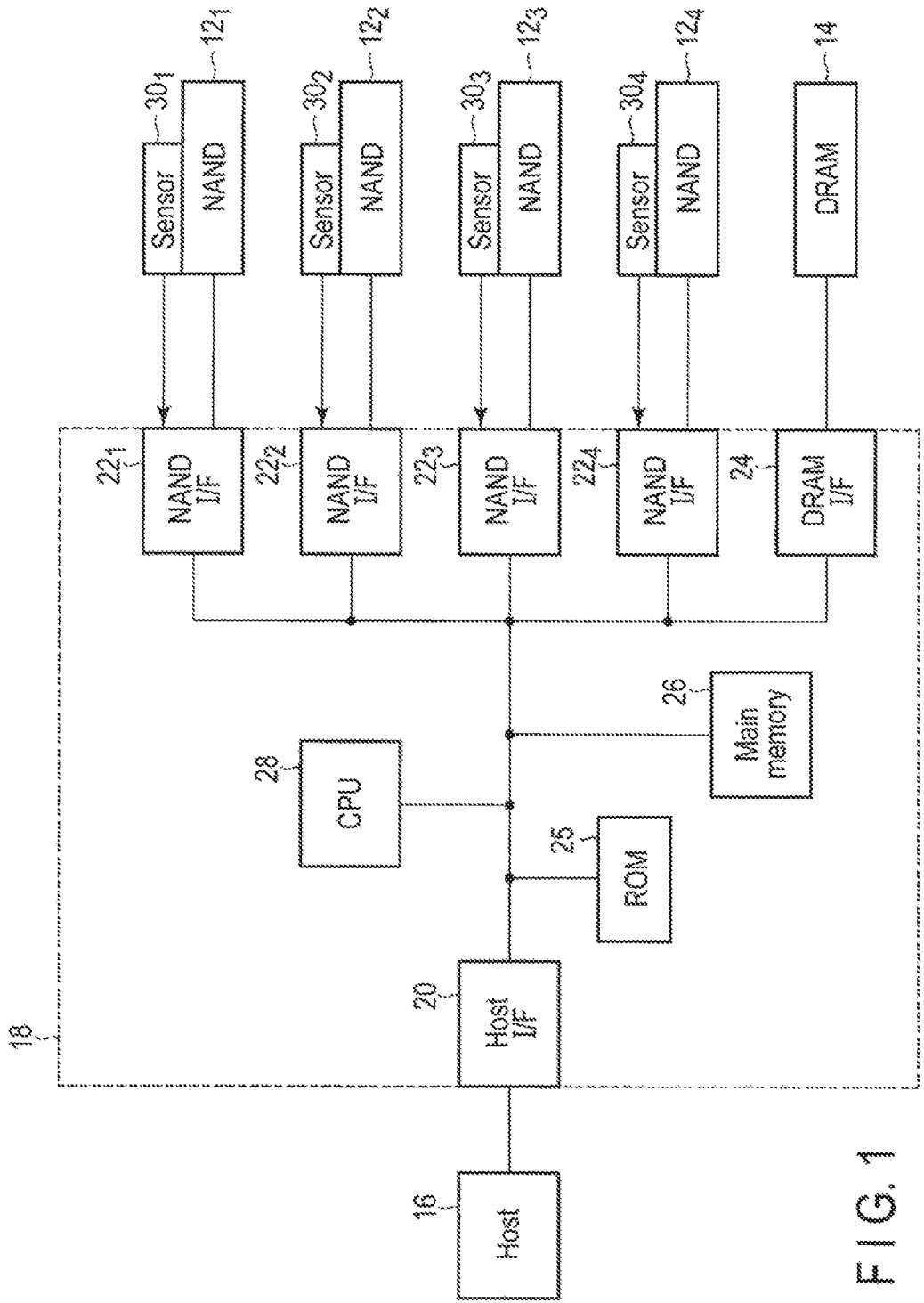
FIG. 1 is a block circuit diagram showing a typical example of a storage device according to an embodiment.

Various embodiments will be described hereinafter with reference to the accompanying drawings.

In general, according to one embodiment, a storage device includes a plurality of nonvolatile semiconductor memories, a sensor and a controller. The sensor is configured to measure a temperature of the nonvolatile semiconductor memories. The controller is configured to receive data from a host, determine a rewriting interval of the data and write the data to, of the nonvolatile semiconductor memories, a nonvolatile semiconductor memory having a temperature corresponding to the rewriting interval.

FIG. 1 is a block diagram snowing a typical configuration of an SSD. Normally, the SSD includes a memory unit and a controller 18 on the same substrate. The external appearance of the SSD is similar to that of an HDD. The memory unit includes, for example, four nonvolatile semiconductor memories $12_1$, $12_2$, $12_3$ and $12_4$, and a DRAM 14. The DRAM 14 is used to temporarily store data, for example, to temporarily store data at the time of reading and writing of the nonvolatile semiconductor memory 12. An example of the nonvolatile semiconductor memory 12 is a flash memory. Here, a HAND-type flash memory is employed. Each of flash memories $12_1$, $12_2$, $12_3$ and $12_4$ is a memory included, in a package of, for example, 128 GB or 512 GB. Each flash memory 12 includes a large number of memory cells for storing data of one bit or a large number of bits (for example, two bits). A plurality of memory cells, for example, memory cells of 2112 bytes (specifically, user data of 2048 bytes and redundant data of 64 bytes) are included in a page. A plurality of pages, far example, sixty four pages are included in a block. Data is written to the flash memory 12 in page units. Data is erased in clock units.

The controller 18 includes NAND interfaces $22_1$, $22_2$, $22_3$ and $22_4$ connected to flash memories $12_1$, $12_2$, $12_3$ and $12_4$, a DRAM interface 24 connected to the DRAM 14, and a host interface 20 connected to a host 16, for example, a personal computer. These interfaces 20, $22_1$, $22_2$, $22_3$, $22_4$ and 24 are connected to the bus line of a CPU 28. A main memory 26 and a ROM 25 are also connected to the bus line. The ROM 25 stores a control program. The control program is loaded into the main memory 26 when the power source is turned on.

Flash memories $12_1$, $12_2$, $12_3$ and $12_4$ include temperature sensors $30_1$, $30_2$, $30_3$ and $30_4$. The outputs of temperature sensors $30_1$, $30_2$, $30_3$ and $30_4$ are also supplied to NAND interfaces $22_1$, $22_2$, $22_3$ and $22_4$.

The host 16 provides the controller 18 with a read command and a write command by specifying a block address. This address is called a logical block address. A physical block address is allocated for the flash memory 12. The controller 18 has an address management table in which the relationship between the logical, block address and the physical block address is recorded. The controller 18 obtains a physical block address corresponding to the logical block address specified by the host 16.

The controller 18 independently starts a refresh process at a predetermine time point regardless of the command from the host 16. The refresh process is equivalent to a process which is performed when a rewrite command is received from the host 16. In other words, the refresh process includes reading of data from a place, writing of the read data to another place, and erasing of the data from she original place. Erasing does not have to be performed immediately. Erasing may be merely applied to the state of management information related to the place (in other words, the physical block address) or the data to be erased. The actual erasing may foe collectively applied to a plurality or blocks later. Thus, the refresh process includes erasing. Therefore, the refresh process is performed in block units which are the units of erasing.

The refresh process needs to be preformed before the stored data is lost. The time limit for retaining the stored data is based on the recent writing tine or the recent erasing time, and the data retention period. Thus, the time limit for retaining data, in other words, the refresh time limit differs depending on the block. The degree of degradation of the insulating film of the flash memory 12 differs depending on she temperature. The data retention period is not constant in flash memories $12_1$, $12_2$, $12_3$ and $12_4$. The data retention period is short at high temperature and is long at low temperature. The controller 18 calculates the refresh time limit for each block according to the recent writing time or the recent erasing time, and the data retention period (which differs depending on the temperature). The controller 18 stores the refresh time limit for each block in a management table. An example of the management table is shown in Table 1.

TABLE 1

| NAND flash memory | Block | Refresh time limit | Number of rewrites/ refreshes | State |
|---|---|---|---|---|
| $12_1$ | 1 | Aug. 15, 2015 15:15 | ** | Writing |
| $12_1$ | 2 | Aug. 16, 2015 05:02 | ** | Erasing |
| ... | ... | ... | ... | ... |
| $12_2$ | 1 | Aug. 18, 2015 15:15 | ** | Writing |
| ... | ... | ... | ... | ... |
| $12_4$ | 1 | Aug. 15, 2015 02:00 | ** | Writing |
| ... | ... | ... | ... | ... |

The controller 18 refers to the management table. When the refresh time limit of a block has been reached, the controller 18 reads data from the block and stores the data in the DRAM 14. Subsequently, the controller 18 writes the data of the DRAM 14 to another block (which may be a block in the same flash memory 12 or may be a block in another flash memory 12). Subsequently, as the data of the block is unnecessary, the information related to the physical block address of the block is modified in the management information of the block address, and is changed to information indicating erasing. The data of the block may be erased immediately.

The controller 18 determines the flash memory to which data should be written in accordance with the rewriting interval of the data to be written. When the host 16 manages a data file in a multi-stream format which includes content and management information, two files are present. One of the two files is, for example, the file of document X. The other one is the file of management information of document X, such as update information, character codes and editors. The update information includes the latest rewriting time and the rewriting time immediately before the latest rewriting time. This means that the management information also includes the rewriting interval, which is the difference between the rewriting times. The controller 18 is capable of recognizing the rewriting interval of document X from the update information of the management information file of document X.

When a data file is managed in a multi-stream format, for example, management information may contain the following information: only reading is performed (in other words, rewriting is prohibited) for document Y; and document Z is rewritten at high frequency.

The flash memory to which data is to be written is determined according to the rewriting intervals. As stated above, the refresh process performed by the controller 18 is equivalent to the rewriting process performed by the host 16. Therefore, when a rewriting process is performed by the host 16 before the refresh time point, the refresh process by the controller 18 is omitted. Thus, data having a long rewriting interval is preferably written to a flash memory 12 having a long data retention period and a long refresh interval in comparison with a flash memory 12 having a short data retention period and a short refresh interval. If data having a long rewriting interval is written to a flash memory 12 having a short refresh interval, there is a high possibility that a refresh process is performed before the host 16 performs a rewriting process. On the contrary, data having a short rewriting interval is preferably written to a flash memory 12 having a short data retention period and a short refresh interval in comparison with a flash memory 12 having a long data retention period and a long refresh interval. If, in a manner opposite to the above, data having a long rewriting interval is written to a flash memory 12 having a short refresh interval, there is a high possibility that the refresh time limit is reached before a data rewrite command is generated from the host 16 after data writing. Thus, it is highly likely that a refresh process is performed. However, if data having a long rewriting interval is written to a flash memory 12 having a long refresh interval, there is a high possibility that a rewrite command is issued from the host 16 before the refresh time limit. Thus, it is highly likely that a refresh process is not performed.

As explained above, a flash memory 12 at high temperature has a short data retention period. Thus, the refresh interval is short. The refresh interval of the flash memory 12 becomes longer with decreasing temperature. In consideration of these factors, the controller 18 writes data having a long rewriting interval to a flash memory 12 having a long refresh interval and a low temperature. The controller 18 writes data having a short rewriting interval to a flash memory 12 having a short refresh interval and a high temperature. When the number of flash memories 12 is four, four categories are set for the rewriting interval. The categories are allocated for flash memories $12_1$, $12_2$, $12_3$ and $12_4$ depending on the temperature of flash memories $12_1$, $12_2$, $12_3$ and $12_4$.

When the format of data files managed by the host 16 is not a multi-stream format, the rewriting intervals of files are estimated in advance according to file type (for example, a document or image indicated by an extension, a file prepared by the user, and a downloaded file) and are stored in a table, etc. The rewriting interval is obtained from the type of a file. In a manner similar to that of the multi-stream format, the file is allocated for a flash memory 12 having a temperature corresponding to the rewriting interval. For example, a document my be set to a short rewriting interval, and an image may be set to a long rewriting interval. A file prepared by the user may be set no a short rewriting interval, and a downloaded file may be set to a long rewriting interval.

After the controller 18 determines the flash memory 12 to which data should be written, the controller 18 determines to which block of the flash memory 12 the data should be written. This determination may be performed by the known wear leveling process. In the flash memory, the upper limit of the rewritable times is determined. In some programs, data is rewritten once several seconds. Thus, the rewriting times of a specific block may have reached the upper limit. To prevent this, the number of rewrites of each physical block is counted and is stored. When a write command is received from the host, the block having the least number of rewrites is selected from the physical blocks. Data is written to the selected block. The logical block address specified by the host is allocated for the physical block address. Thus, a wear leveling process is performed. In this manner, repetitive data writing is not occurred for the same physical address. Thus, writing is equalized. It is possible to prevent the number of rewrites of some blocks from reaching the upper limit.

FIG. 2 is a flowchart which shows the flow of a process performed by the controller 18 and the operation of the storage device. When the power source is turned on, the controller 18 measures the temperature of flash memories $12_1$, $12_2$, $12_3$ and $12_4$ according to signals from sensors $30_1$, $30_2$, $30_3$ and $30_4$ in block 42. In block 44, the controller 18 determines whether or not a command is received from the host 16. When a command is not received as a result of determination, the controller 18 performs the process of block 60. When the received command is a read command, data is read in block 46. Subsequently, the controller 18 performs the process of block 72.

When the received, command is a write command or a rewrite command, the controller 18 calculates the rewriting interval of the target data file in block 48. When the data file format is a multi-stream format, the latest rewriting time and the rewriting time immediately before the latest rewriting time are read from the file of management information. The rewriting interval is calculated from the difference between the rewriting times. When the data file format is not a multi-stream format, the rewriting interval is obtained from the table according to the type of file.

In block 50, the controller 18 selects the flash memory to which the file should be written according to the rewriting interval based on the relationship shown in Table 2. When four categories are set for the rewriting interval since the number of flash memories is four, and the rewriting interval is included in the shortest interval category, the flash memory having the highest temperature is selected. When the rewriting interval is included in the second shortest interval category, the flash memory having the second highest temperature is selected. When the rewriting interval is included in the second longest interval category, the flash memory having the second lowest temperature is selected. When the rewriting interval is included in the longest interval category, the flash memory having the lowest temperature is selected. Thus, the shorter the rewriting interval is, the higher the temperature of the flash memory the controller 18 selects. The longer the rewriting interval is, the lower the temperature of the flash memory the controller 18 selects.

TABLE 2

| Rewriting interval (Pr) | Flash memory to be selected |
|---|---|
| $0 < Pr \leq t_1$ | Memory having highest temperature |
| $t_1 < Pr \leq t_2$ | Memory having second highest temperature |
| $t_2 < Pr \leq t_3$ | Memory having second lowest temperature |
| $t_3 < Pr$ | Memory having lowest temperature |

Alternatively, the control for 18 may select a flash memory having a temperature higher than a predetermined temperature when the rewriting interval is shorter than a predetermined interval. The controller 18 may select a flash memory having a temperature which is not higher than the predetermined temperature when the rewriting interval is not shorter than the predetermined interval.

When the remaining capacity of the selected flash memory is less than or equal to a predetermined value, a flash memory having the next lowest, or next highest temperature to that of the selected flash memory is selected regardless of the above rules.

In block 52, the controller 18 determines to which block of the flash memory selected in block 50 the data should be written. The controller 18 reads the number of rewrites/refreshes of each, block of the selected flash memory from the management table shown in Table 1, and determines the block to which the data should be written such that the number of rewrites/refreshes is equalized (wear leveling process). The data from the host 16 is written to the determined block.

In block 54, the controller 18 updates the refresh time limit, the number of rewrites/refreshes and the state of the management table.

In block 60, the controller 18 refers to the management table and determines whether or not the refresh time limit of any block has been reached. When the refresh time limit has not been reached in any block, the controller 18 performs the process of block 72.

When the refresh time limit of a block has been reacted, the controller 18 reads the data of the block and writes the data to the DRAM 14 in block 62.

In block 64, the controller 18 obtains the rewriting Interval of the read data file. In block 66, the controller 18 selects the flash memory to which the file should be written in accordance with the relationship shown in Table 2.

In block 68, the controller 18 determines to which block of the flash memory selected in block 66 the data should be written. The controller 18 reads the number of rewrites/refreshes of each block of the selected flash memory from the management table shown in Table 1, and determines the block to which the data should be written such that the number of rewrites/refreshes is equalized (wear leveling process). The data in the DRAM 14 is written to the determined block.

In block 70, the controller 13 updates the refresh time, the number of rewrites/refreshes and the state of the management table.

In block 72, the controller 18 determines whether or not a suspend command is generated. When a suspend command is generated, the controller 18 suspends the process. When a suspend command is not generated, the process of block 42 is repeated. Thus, the procedure from block 42 to block 54 is repeated until a block of a flash memory has reached the refresh time limit. When a write or a rewrite command is transmitted during this period, the data of the block is rewritten. Thus, the refresh time limit is reset, and no refresh process is performed. Data is written to a block having a temperature, that is, a refresh interval, corresponding to the rewriting interval. Therefore, there is a high possibility that a write or rewrite command is transmitted from the host before the refresh time limit is reached. Thus, it is unlikely that a refresh process is performed.

As explained above, according to the embodiment, in the SSD including a plurality of flash memories, the rewriting interval of data is obtained at the time of data writing or data rewriting. The data is written to a flash memory having a temperature corresponding to chat the rewriting interval. Thus, there is a high possibility chat a data rewrite command is received from the host before the refresh time limit is reached. The reading/writing of the host is suspended. In this manner, there is a low possibility that a refresh process which deteriorates the reading/writing performance of the host is performed. Since data is rewritten by the rewrite command from the host, potential is applied again to the floating gate. Thus, the stored data is not lost.

When a refresh process is performed, in a manner similar to the above, data is written to a flash memory having a temperature corresponding to the rewriting interval of the data. Thus, an effect similar to the above is obtained.

Because of the above factors, the performance of the device, and the product life of the device can be improved.

In the above explanation, a flesh memory is explained as a nonvolatile semiconductor memory. However, the present embodiment is not limited to this example. The present embodiment can be applied as long as the stored data could be lost over time in spite of the non-volatility.

In the above description, a sensor is provided for each chip of the flash memory, and a chip is selected according to the rewriting interval and the temperature. However, the temperature of each chip is based on the distance from the CPU mounted on the substrate. Therefore, only one sensor may be provided for a plurality of chips which can be considered as having the same temperature as they are provided in similar positions. A plurality of sensors may be provided in a chip such that the temperature is measured for each area in the chip.

In the above explanation, data is written to a flash memory having a temperature corresponding the rewriting interval of the data both when data is written to a flash memory for the first time by a write command from the host and when the data of a flash memory is rewritten through a refresh process toy the controller. However, only in one of the cases, data may be written to a flash memory corresponding to the rewriting interval and the temperature. For example, when data is written to a flash memory for the first time by a write command from the host, data may be written to a predefined flash memory.

The method for obtaining the rewriting interval is not limited to the above examples. The rewriting interval can be obtained according to, for example, various types of attribute information, or the type of application using the data file.

The various modules of the systems described herein can be implemented as software applications, hardware and/or software modules, or components on one or more computers, such as servers. While the various modules are illustrated separately, they may snare some or all of the same underlying logic or code.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the split of the inventions. The accompanying claims and their equivalents are intended to cover such forms or modifications as would fall within the scope and spirit of the inventions.

What is claimed is:

1. A storage device comprising:
a plurality of nonvolatile semiconductor memories;
a sensor configured to measure a temperature of the nonvolatile semiconductor memories; and
a controller configured to determine a rewriting interval of data to be written to the nonvolatile semiconductor memories, and write the data to, of the nonvolatile semiconductor memories, a nonvolatile semiconductor memory having a temperature corresponding to the rewriting interval.

2. The storage device of claim 1, wherein
the controller is further configured to write the data to a nonvolatile semiconductor memory having a temperature higher than a predetermined temperature when the rewriting interval is shorter than a predetermined interval, and write the data to a nonvolatile semiconductor memory having a temperature which is not higher than the predetermined temperature when the rewriting interval is not shorter than the predetermined interval.

3. The storage device of claim 1, wherein
the controller is further configured to read the rewriting interval included in management information of data received from the host in a multi-stream format.

4. The storage device of claim 1, wherein
the controller is further configured to determine the rewriting interval, according to a type of the data.

5. The storage device of claim 1, wherein
each of the nonvolatile semiconductor memories comprises a plurality of blocks, and data is configured to be erased in block units,
the controller is further configured to manage a refresh time limit for each block of the nonvolatile semiconductor memories and perform a refresh process at the refresh time limit of a first block of a first nonvolatile semiconductor memory, and
the refresh process comprises reading data from the first block of the first nonvolatile semiconductor memory, and writing the read data to a second block of the first nonvolatile semiconductor memory or a block of another nonvolatile semiconductor memory in accordance with the rewriting interval of the data.

6. The storage device of claim 5, wherein
the controller is further configured to determine a block to which data is to be written such that the number of refreshes is equalized in the blocks.

7. The storage device of claim 1, wherein
each of the nonvolatile semiconductor memories comprises a plurality of blocks, and data is configured to be erased in block units, and
the controller is further configured to, when a rewrite command of a first block of a first nonvolatile semiconductor memory is received from the host, read data from, the first block of the first nonvolatile semiconductor memory, write the read data to a second block of the first nonvolatile semiconductor memory or a block of another nonvolatile semiconductor memory in accordance with a rewriting interval of the data, and erase the data of the first block of the first nonvolatile semiconductor memory.

8. The storage device of claim 7, wherein
the controller is further configured to determine a block to which data is to be written sues that the number of rewrites is equalized in the block.

9. A storage method comprising:
measuring a temperature of a plurality of nonvolatile semiconductor memories;
determining a rewriting interval of data received from a host; and
writing the data to, of the nonvolatile semiconductor memories, a nonvolatile semiconductor memory having a temperature corresponding to the rewriting interval.

10. The storage method or claim 9, wherein
the writing comprises writing the data to a nonvolatile semiconductor memory having a temperature higher than a predetermined temperature when the rewriting interval is shorter than a predetermined interval, and writing the data to a nonvolatile semiconductor memory having a temperature which is nor higher than the predetermined temperature when the rewriting interval is not shorter than the predetermined interval.

11. The storage method of claim 9, wherein
the determining comprises reading the rewriting interval included in management information of data received from the host in a multi-stream format.

12. The storage method of claim 9, wherein
the determining comprises determining the rewriting interval according to a type of the data.

13. The storage method of claim 9, wherein
each of the nonvolatile semiconductor memories comprises a plurality of blocks, and data is configured to be erased in block units, and
the storage method further comprises;
    managing a refresh time limit for each block of the nonvolatile semiconductor memories; and
    performing a refresh process at the refresh time limit of a first block of a first nonvolatile semiconductor memory, wherein
    the refresh process comprises reading data from the first block of the first nonvolatile semiconductor memory, and writing the read data to a second block of the first nonvolatile semiconductor memory or a block of another nonvolatile semiconductor memory in accordance with the rewriting interval of the data.

14. The storage method of claim 13, wherein
the refresh process comprises determining a block to which data is to be written such that the number of refreshes is equalized in the blocks.

15. The storage method of claim 9, wherein
each of the nonvolatile semiconductor memories comprises a plurality of blocks, and data is configured to be erased in block units, and
the storage method comprises:
    receiving a rewrite command of a first block of a first nonvolatile semiconductor memory from the host;
    reading data from the first block of the first nonvolatile: semiconductor memory;
    writing the read data to a second block of the first nonvolatile semiconductor memory or a block of another nonvolatile semiconductor memory in accordance with the rewriting interval of the data; and
    erasing the data of the first block of the first nonvolatile semiconductor memory.

16. The storage method of claim 15, further comprising:
determining a block to which data is to be written such that the number of rewrites is equalized in the blocks.

17. A storage device comprising:
a plurality of nonvolatile semiconductor memories;
a sensor configured to measure a temperature of the nonvolatile semiconductor memories;
a host configured to access the nonvolatile semiconductor memories; and
a controller connected between the nonvolatile semiconductor memories and the host, wherein
the controller is configured to
    obtain a rewriting interval of data to be written to the nonvolatile semiconductor memories,
    write the data to a nonvolatile semiconductor memory having a temperature higher than a predetermined temperature when the rewriting interval is shorter than a predetermined interval, and write the data to a nonvolatile semiconductor memory having a temperature which is not higher than the predetermined temperature when the rewriting interval is not shorter than the predetermined interval, and
    apply a refresh process to the nonvolatile semiconductor memories in intervals corresponding to temperatures of the nonvolatile semiconductor memories,
wherein the refresh process comprises:
    reading data from a first clock of a first nonvolatile semiconductor memory, and
    writing the read data to a second block of the first nonvolatile semiconductor memory or a block of another nonvolatile semiconductor memory in accordance with the rewriting interval of the data.

18. The storage device of claim 17, wherein
the controller is further configured to read the rewriting interval included in management information of data received, from the host in a multi-stream format.

19. The storage device of claim 17, wherein
the controller is further configured to determine the rewriting interval according to a type of the data.

20. The storage device of claim 17, wherein
the controller is further configured to determine a block to which data is to be written such that the number of writes and the number of refreshes are equalized in the blocks.

* * * * *

UNITED STATES PATENT AND TRADEMARK OFFICE
CERTIFICATE OF CORRECTION

PATENT NO. : 9,984,731 B2
APPLICATION NO. : 14/971856
DATED : May 29, 2018
INVENTOR(S) : Masahiro Kiyooka Page 1 of 2

It is certified that error appears in the above-identified patent and that said Letters Patent is hereby corrected as shown below:

In the Specification

Column 1, Line 52, change "is" to --to--.

Column 2, Line 17, change "HAND" to --NAND--;
    Line 27, change "clock" to --block--;
    Line 57, change "she" to --the--;
    Line 62, change "foe" to --be--; and change "or" to --of--.

Column 3, Line 1, change "tine" to --time--; and
    Line 6, change "she" to --the--.

Column 4, Line 54, change "no" to --to--.

Column 5, Line 21, delete ","; and
    Line 63, change "control for" to --controller--.

Column 6, Line 11, delete ",";
    Line 25, change "reacred" to --reach--;
    Line 28, change "Interval" to --interval--; and
    Line 64, change "chat" to --that--.

Column 7, Line 11, change "flesh" to --flash--;
    Line 31, change "toy" to --by--; and
    Line 46, change "snare" to --share--.

In the Claims

Claim 8, Line 3, change "sues" to --such--.

Signed and Sealed this
Eleventh Day of December, 2018

Andrei Iancu
*Director of the United States Patent and Trademark Office*

CERTIFICATE OF CORRECTION (continued)
U.S. Pat. No. 9,984,731 B2

Claim 10, Line 1, change "or" to --of--; and
    Line 7, change "nor" to --not--.

Claim 15, Line 8, delete ":".

Claim 17, Line 24, change "clock" to --block--.

Claim 18, Line 4, delete ",".